(12) United States Patent
Tetzlaff

(10) Patent No.: US 7,336,755 B1
(45) Date of Patent: Feb. 26, 2008

(54) PLL WITH LOW PHASE NOISE NON-INTEGER DIVIDER

(75) Inventor: David E. Tetzlaff, Minnetonka, MN (US)

(73) Assignee: Xilinx, Inc., San Jose, CA (US)

( * ) Notice: Subject to any disclaimer, the term of this patent is extended or adjusted under 35 U.S.C. 154(b) by 657 days.

(21) Appl. No.: 10/864,241

(22) Filed: Jun. 8, 2004

(51) Int. Cl.
*H03D 3/24* (2006.01)

(52) U.S. Cl. .................. 375/376; 375/373; 327/156

(58) Field of Classification Search ........... 375/376, 375/374, 373, 375; 327/156, 157, 158, 159
See application file for complete search history.

(56) References Cited

U.S. PATENT DOCUMENTS

| | | | |
|---|---|---|---|
| 6,424,192 B1 * | 7/2002 | Lee et al. ............ | 327/156 |
| 6,542,013 B1 * | 4/2003 | Volk et al. ........... | 327/115 |
| 6,687,320 B1 * | 2/2004 | Chiu et al. ........... | 375/376 |
| 6,943,599 B2 * | 9/2005 | Ngo .................. | 327/156 |
| 6,956,440 B2 * | 10/2005 | Choi ................. | 331/1 A |
| 2001/0032323 A1 * | 10/2001 | Takagi et al. ........ | 713/500 |
| 2003/0189503 A1 * | 10/2003 | Kim et al. ........... | 341/100 |

* cited by examiner

*Primary Examiner*—Chieh M. Fan
*Assistant Examiner*—Jaison Joseph
(74) *Attorney, Agent, or Firm*—Timothy W. Markison; T. Lester Wallace

(57) ABSTRACT

A phase-locked loop with a non-integer divider utilizes a state machine to periodically select a new clock from a plurality of clocks for comparison to a reference signal after division by an integer divide by N block. Based on a desired divider ratio, the state machine selects the new clock that is phase shifted with respect to a presently selected clock. Each change from the presently selected clock to the new clock produces a selected clock cycle that is expanded or contracted by the amount of phase shift between the new clock and the presently selected clock. The integer divide by N block divides the selected clock by the integer portion of the desired divider ratio producing a divided clock that is effectively divided by a non-integer amount.

28 Claims, 10 Drawing Sheets phase-locked loop with low phase noise non-integer divider

Figure 1 programmable logic device 10 programmable MGTs 14 - 28 phase-locked loop with low phase noise non-integer divider programmable fabric transceiver four phase clock output State machine for divide by 8.25 desired divider ratio of 8.25 desired divider ratio of 7.75 desired divider ratio of 8.25 non-integer divider method

PLL WITH LOW PHASE NOISE NON-INTEGER DIVIDER

BACKGROUND OF THE INVENTION

1. Technical Field of the Invention

This invention relates generally to communication systems and more particularly to phase-locked loop circuits used therein.

2. Description of Related Art

Communication systems are known to transport large amounts of data between a plurality of end user devices, which, for example, include telephones, facsimile machines, computers, television sets, cellular telephones, personal digital assistants, etc. As is known, such communication systems may be local area networks (LANs) and/or wide area networks (WANs) that are stand-alone communication systems or interconnected to other LANs and/or WANs as part of a public switched telephone network (PSTN), packet switched data network (PSDN), integrated service digital network (ISDN), or Internet. As is further known, communication systems include a plurality of system equipment to facilitate the transporting of data. Such system equipment includes, but is not limited to, routers, switches, bridges, gateways, protocol converters, frame relays, and private branch exchanges.

The transportation of data within communication systems is governed by one or more standards that ensure the integrity of data conveyances and fairness of access for data conveyances. For example, there are a variety of Ethernet standards that govern serial transmissions within a communication system at data rates of 10 megabits-per-second, 100 megabits-per-second, 1 gigabit-per-second and beyond. Synchronous Optical NETwork (SONET), for example, currently provides for up to 10 gigabits-per-second. In accordance with such standards, many system components and end user devices of a communication system transport data via serial transmission paths. Internally, however, the system components and end user devices may process data in a parallel manner. As such, each system component and end user device must receive the serial data and convert the serial data into parallel data without loss of information. After processing the data, the parallel data must be converted back to serial data for transmission without loss of information.

Accurate recovery of information from high-speed serial transmissions typically requires transceiver components that operate at clock speeds equal to or higher than the received serial data rate. Higher clock speeds require oscillator circuits to have gain-bandwidth products to sustain high frequency oscillations while maintaining low phase noise. High phase noise contributes to clock jitter which degrades clock recovery in high-speed circuits. Higher clock speeds limit the usefulness of prior art clock recovery circuits that require precise alignment of signals to recover clock and/or data. Higher data rates require greater bandwidth for a feedback loop of the clock recovery circuits to operate correctly. Some prior art designs are bandwidth limited.

As the demand for data throughput increases, so do the demands on a high-speed serial transceiver. The increased throughput demands are pushing some current integrated circuit manufacturing processes to their operating limits. Integrated circuit processing limits (e.g., device parasitics, trace sizes, propagation delays, device sizes) and integrated circuit (IC) fabrication limits (e.g., IC layout, frequency response of the packaging, frequency response of bonding wires) limit the speed at which the high-speed serial transceiver may operate without excessive jitter performance or phase noise performance.

One solution for high-speed serial transceivers is to use an IC technology that inherently provides for greater speeds. For instance, switching from a Complementary Metal-Oxide Semiconductor (CMOS) process to a silicon germanium or gallium arsenide process would allow integrated circuit transceivers to operate at greater speeds, but at substantially increased manufacturing costs. CMOS is more cost effective and provides easier system integration. Currently, for most commercial-grade applications, including communication systems, such alternate integrated circuit fabrication processes are too cost prohibitive for widespread use.

Modern communication systems, including high data rate communication systems, typically include a plurality of circuit boards that communicate with each other by way of signal traces, bundled data lines, back planes, etc. Accordingly, designers of high data rate communication transceiver devices often have conflicting design goals that relate to the performance of the particular device. For example, there are many different communication protocols specified for data rates that range from 2.48832 gigabits-per-second for OC48, to 9.95 gigabits-per-second for OC192. Other known standards define data rates of 2.5 gigabits-per-second (INFINIBAND) or 3.125 gigabits-per-second (XAUI). For example, one protocol may specify a peak voltage range of 200-400 millivolts, while another standard specifies a mutually exclusive voltage range of 500-700 millivolts. Thus, a designer either cannot satisfy these mutually exclusive requirements (and therefore cannot support multiple protocols) or must design a high data rate transceiver device that can adapt according to the protocol being used for the communications.

Along these lines, field programmable gate array (FPGA) circuits are gaining in popularity for providing the required flexibility and adaptable performance, as described above, for those designers that seek to build one device that can operate according to multiple protocols. Thus, while FPGA technology affords a designer an opportunity to develop flexible and configurable hardware circuits, specific designs that achieve the desired operations must still be developed. Accordingly, there is a need for oscillator circuits within a transceiver device that achieves these design objectives. While traditional phase-locked loops include oscillators that produce an oscillation based on a current, integrated circuit designs desirably include oscillators formed from integrated circuit devices. Additionally, traditional phase-locked loops include integer based divider circuits to maintain the phase-locked condition, effectively limiting the oscillating frequency to an integer multiple of a reference signal. There is a need, therefore, for an integrated circuit based oscillator that provides the desired oscillations in a variable manner within specified phase noise constraints.

BRIEF SUMMARY OF THE INVENTION

The present invention provides for a device and a method for producing low phase noise oscillations for use in high data rate serial devices. Generally, the present invention includes circuitry for a phase-locked loop (PLL) including a non-integer divider. The low phase-noise voltage controlled oscillations are provided to clock circuits, high data rate field programmable gate array fabric, or to any circuit portion requiring low phase-noise oscillations. In one embodiment, a voltage controlled oscillator (VCO) in the PLL produces a plurality of clocks, wherein each clock is shifted in phase from a preceding clock. The plurality of clocks, in one embodiment, is equal to any one of two, four, six, eight, ten, twelve, sixteen or thirty two. A state machine activates a multiplexer to couple a new clock from the plurality of clocks based on a phase difference between the presently selected clock and the new clock. The phase difference functions to effectively expand and contract, on a periodic basis, a cycle of the selected clock. This expanded or contracted clock cycle, when divided by an integer divide by N block (where N is an integer), produces an effective non-integer divided clock that will be compared in phase/frequency with the reference signal. The VCO oscillating frequency will be substantially equal to the reference signal multiplied by the non-integer divider ratio.

In one embodiment, the VCO produces four clocks that are phase shifted 90 degrees or one-quarter cycle from each other. A state machine, based on a received desired divider ratio, dynamically generates a clock select signal coincident with the rising edge of the divided clock to select the new clock that leads or lags the presently selected clock by 90 degrees. The clock select signal activates the multiplexer when the new clock and the presently selected clock are at similar logic states thereby avoiding abrupt changes in the phase of the selected clock that would otherwise be coupled to a phase/frequency to voltage converter block and ultimately to the VCO.

In the one embodiment of the present invention, the state machine receives a desired divider ratio that has a non-integer value. Based on the non-integer portion of the desired divider ratio, the state machine generates the clock select signal to select the new clock that leads the presently selected clock by 90 degrees to achieve a divider ratio of "N.75", for example, "7.75". Alternately, the state machine generates the clock select signal to select the new clock that lags the presently selected clock by 90 degrees to achieve a divider ratio of "N.25", for example, "8.25".

The above-referenced description of the summary of the invention captures some, but not all, of the various aspects of the present invention. The claims are directed to some of the various other embodiments of the subject matter towards which the present invention is directed. In addition, other aspects, advantages and novel features of the invention will become apparent from the following detailed description of the invention when considered in conjunction with the accompanying drawings.

DETAILED DESCRIPTION OF THE INVENTION

Figure 1:
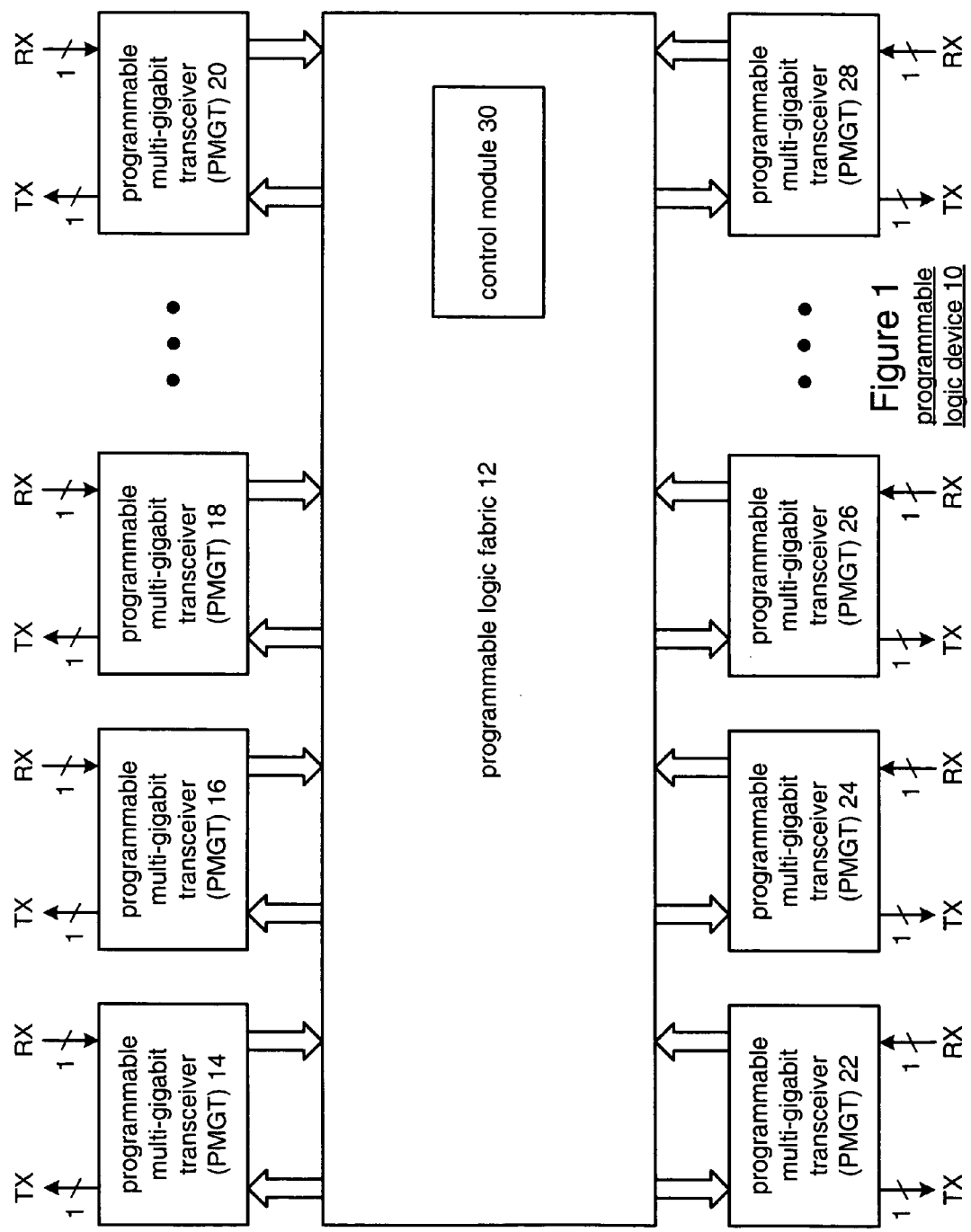
FIG. 1 is a schematic block diagram of a programmable logic device that includes programmable logic fabric, a plurality of programmable multi-gigabit transceivers (PMGTs) and a control module.

FIG. 1 is a schematic block diagram of a programmable logic device 10 that includes programmable logic fabric 12, a plurality of programmable multi-gigabit transceivers (PMGTs) 14-28 and a control module 30. The programmable logic device 10 may be a programmable logic array device, a programmable array logic device, an erasable programmable logic device, and/or a field programmable gate array (FPGA). When the programmable logic device 10 comprises a FPGA, the programmable logic fabric 12 may be implemented as a symmetric array configuration, a row-based configuration, a sea-of-gates configuration, and/or a hierarchical programmable logic device configuration. The programmable logic fabric 12 may further include at least one dedicated fixed processor, such as a microprocessor core, to further facilitate the programmable flexibility offered by programmable logic device 10.

The control module 30 may be contained within the programmable logic fabric 12 or it may be a separate module. In either implementation, control module 30 generates control signals to program transmit and receive sections of each of the PMGTs 14-28. In general, each of the PMGTs 14-28 performs a serial-to-parallel conversion on receive data and performs a parallel-to-serial conversion on transmit data. The parallel data may be, for instance, 8-bits wide, 16-bits wide, 32-bits wide, or 64-bits wide.

Typically, the serial data will be a 1-bit stream of data that may be a binary level signal, a multi-level signal, etc. Further, two or more programmable multi-gigabit transceivers may be bonded together to provide greater transmitting speeds. For example, if PMGTs 14, 16 and 18 are transceiving data at 3.125 gigabits-per-second, the PMGTs 14, 16 and 18 may be bonded together such that the effective serial data rate is approximately 3 times 3.125 gigabits-per-second.

Each of the programmable multi-gigabit transceivers 14-28 may be individually programmed to conform to separate standards. In addition, the transmit path and receive path of each programmable multi-gigabit transceiver 14-28 may be separately programmed such that the transmit path of a transceiver is supporting one standard while the receive path of the same transceiver is supporting a different standard. Further, the serial data rates of the transmit path and receive path may be programmed, for example, from 1 gigabit-per-second to tens of gigabits-per-second. The size of the parallel data in the transmit and receive sections, or paths, is also programmable and may vary, for instance, from 8-bits, 16-bits, 32-bits, or 64-bits.

Figure 2:
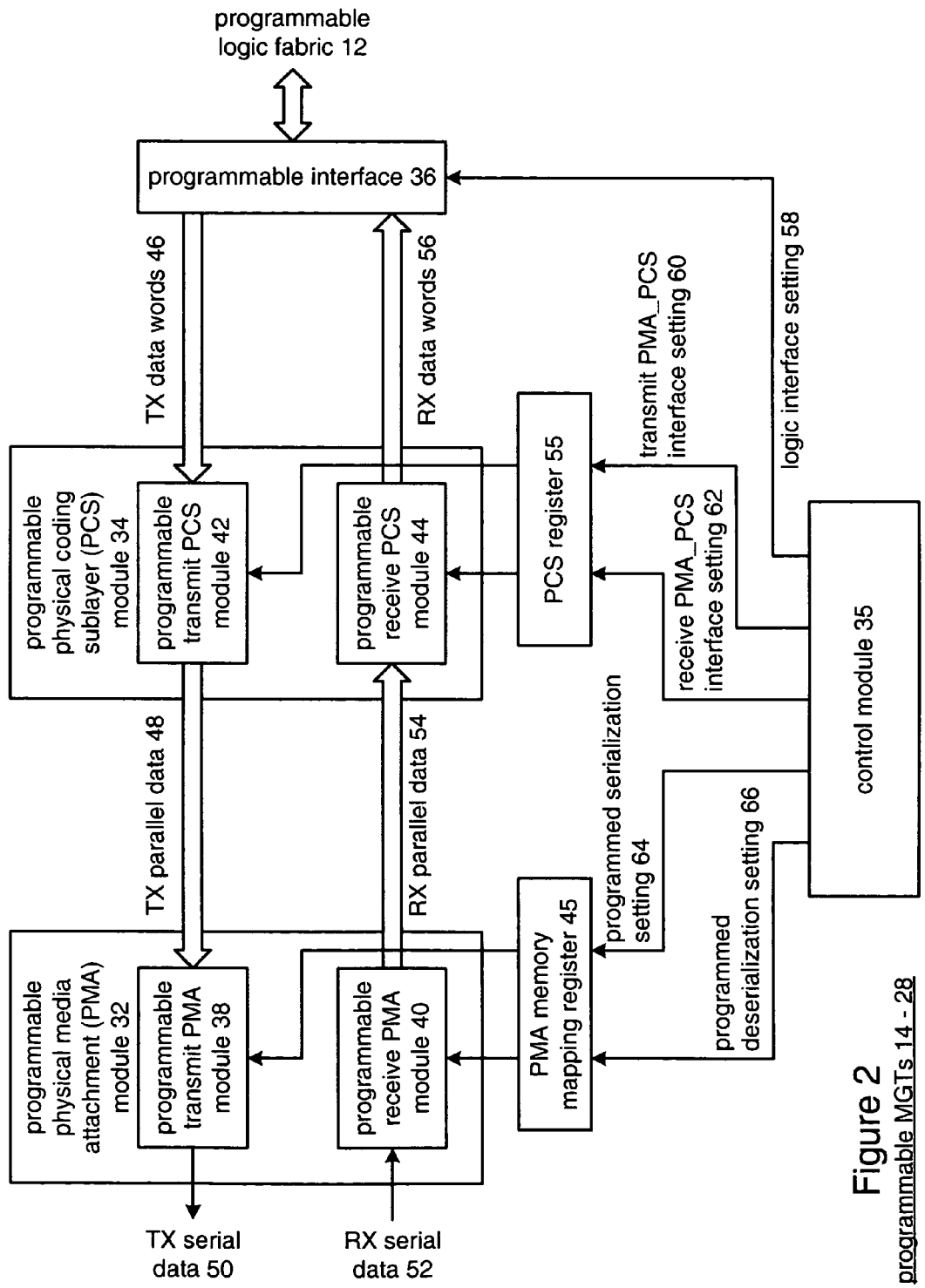
FIG. 2 is a schematic block diagram of one embodiment of a representative one of the programmable multi-gigabit transceivers.

FIG. 2 is a schematic block diagram of one embodiment of a representative one of the programmable multi-gigabit transceivers 14-28. As shown, the programmable multi-gigabit transceiver 14-28 includes a programmable physical media attachment (PMA) module 32, a programmable physical coding sublayer (PCS) module 34, a programmable interface 36, a control module 35, a PMA memory mapping register 45 and a PCS register 55. The control module 35, based on the desired mode of operation for the individual programmable multi-gigabit transceiver 14-28, generates a programmed deserialization setting 66, a programmed serialization setting 64, a receive PMA_PCS interface setting 62, a transmit PMA_PCS interface setting 60, and a logic interface setting 58. The control module 35 may be a separate device within each of the programmable multi-gigabit transceivers or included partially or entirely within the control module 30 of FIG. 1.

In either embodiment of the control module 35, the programmable logic device control module 30 determines the corresponding overall desired operating conditions for the programmable logic device 10 and provides the corresponding operating parameters for a given programmable multi-gigabit transceiver to its control module 35, which generates the settings 58-66.

The programmable PMA module 32 includes a programmable transmit PMA module 38 and a programmable receive PMA module 40. The programmable transmit PMA module 38 is operably coupled to convert transmit parallel data 48 into transmit serial data 50 in accordance with the programmed serialization setting 64. The programmed serialization setting 64 indicates the desired rate of the transmit serial data 50, the desired rate of the transmit parallel data 48, and the data width of the transmit parallel data 48. The programmable receive PMA module 40 is operably coupled to convert receive serial data 52 into receive parallel data 54 based on the programmed deserialization setting 66. The programmed deserialization setting 66 indicates the rate of the receive serial data 52, the desired rate of the receive parallel data 54, and the data width of the receive parallel data 54. The PMA memory mapping register 45 may store the programmed serialization setting 64 and the programmed deserialization setting 66.

The programmable physical coding sublayer (PCS) module 34 includes a programmable transmit PCS module 42 and a programmable receive PCS module 44. The programmable transmit PCS module 42 receives transmit data words 46 from the programmable logic fabric 12 via the programmable interface 36 and converts them into the transmit parallel data 48 in accordance with the transmit PMA_PCS interface setting 60. The transmit PMA_PCS interface setting 60 indicates the rate of the transmit data words 46, the size of the transmit data words (e.g., one byte, two bytes, three bytes, four bytes) and the corresponding transmission rate of the transmit parallel data 48. The programmable receive PCS module 44 converts the receive parallel data 54 into receive data words 56 in accordance with the receive PMA_PCS interface setting 62. The receive PMA_PCS interface setting 62 indicates the rate at which the receive parallel data 54 will be received, the width of the receive parallel data 54, the transmit rate of the receive data words 56 and the word size of the receive data words 56.

The control module 35 also generates the logic interface setting 58 that provides the rates at which the transmit data words 46 and receive data words 56 will be transceived with the programmable logic fabric 12. Note that the transmit data words 46 may be received from the programmable logic fabric 12 at a different rate than the receive data words 56 are provided to the programmable logic fabric 12.

As one of average skill in the art will appreciate, each of the modules within the programmable PMA module 32 and programmable PCS module 34 may be individually programmed to support a desired data transfer rate. The data transfer rate may be in accordance with a particular standard such that the receive path, i.e., the path through programmable receive PMA module 40 and the programmable receive PCS module 44 may be programmed in accordance with one standard, while the transmit path, i.e., the path through the programmable transmit PCS module 42 and the programmable transmit PMA module 38, may be programmed in accordance with the same or another standard.

Figure 3:
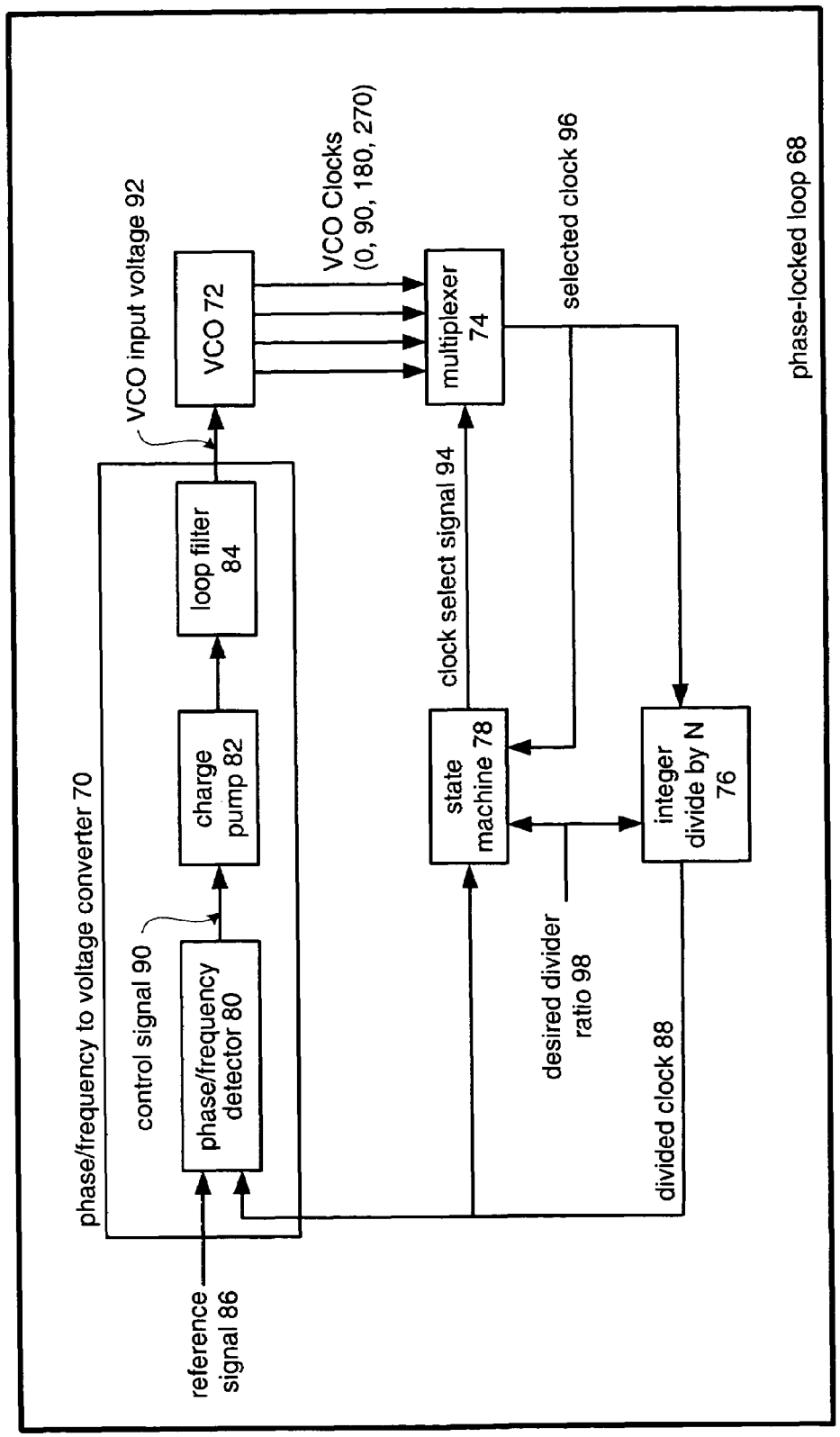
FIG. 3 is a schematic block diagram of a phase-locked loop (PLL) for high data rate serial communications with a low phase noise non-integer divider.

FIG. 3 is a schematic block diagram of a phase-locked loop for high data rate serial communications with a low phase noise non-integer divider. Phase-locked loops are used to provide local oscillations in high data rate circuitry such as the programmable receive and transmit modules of FIG. 2. A phase-locked loop 68 comprises a phase/frequency to voltage converter block 70, a voltage controlled oscillator (VCO) 72, a multiplexer 74, a programmable integer divide by N block 76, and a state machine 78.

Phase/frequency to voltage converter block 70 includes a phase/frequency detector 80, a charge pump 82, and a loop filter 84. Generally, the present embodiments of the present invention may be applied in the context of a phase-voltage converter or a frequency to voltage converter. Accordingly, the reference to phase/frequency to voltage converter and phase/frequency detector refers to both phase and/or frequency to voltage converters and phase and/or frequency detectors, respectively. Phase/frequency detector 80 is coupled to receive a reference signal 86 and a divided clock 88, produced by integer divide by N block 76, and produces a control signal 90 proportional to the phase and/or frequency difference between reference signal 86 and divided clock 88. Control signal 90 will cause charge pump 82 to either inject current into or remove current from loop filter 84 thereby changing VCO input voltage 92 produced from loop filter 84. The VCO 72 receives the VCO input voltage 92 from loop filter 84 and produces a plurality of oscillation signals therefrom that may be used as output clocks of the PLL.

The VCO 72 comprises a ring oscillator and a plurality of delay elements wherein each delay element produces an output oscillation delayed in time from an input oscillation. The VCO input voltage 92 functions to adjust the delay time of each delay element to keep the PLL in phase lock. The ring oscillator output frequency, as is known to one of average skill in the art, is two times the number of delay elements multiplied by the delay of each element. In a single ended embodiment of the present invention, the ring oscillator comprises four delay elements thereby producing four VCO clocks that are delayed such that each clock is 90 degrees out of phase with the preceding clock. In a differential embodiment, the number of delay elements is one-half the number of clocks of the plurality of clocks.

The plurality of clocks produced from VCO 72 is coupled to the input of multiplexer 74. Based on the logic state of clock select signal 94, multiplexer 74 couples one of the VCO clocks to the output as selected clock 96. Clock select signal 94 is produced by programmable state machine 78 according to a desired divider ratio 98. In the present embodiment, state machine 78 detects the rising edge of divided clock 88 and changes the logic state of clock select signal 94 in order to couple one of the VCO clocks to the output of multiplexer 74 as selected clock 96. Selected clock 96 is coupled to state machine 78 and to integer divide by N block 76. Integer divide by N block 76 receives desired divider ratio 98 and divides selected clock 96 by the integer portion of the desired divider ratio to produce divided clock 88. As mentioned previously, divided clock 88 is coupled to phase/frequency detector 80 where it is compared in phase and/or frequency to the reference signal in order to adjust the frequency of VCO 72.

In the present embodiment, VCO 72 produces four VCO clocks that are 90 degrees out of phase with each other. However, any number of VCO clocks may be used to produce the desired non-integer divider ratio. For example, four clocks produce a resolution of one-quarter cycle by nature of being 90 degrees out of phase with each clock. The number of clocks may be increased to achieve any desired divider resolution. For example, a 16-element ring oscillator produces 16 VCO clocks phase delayed from each other by 22½ degrees or $1/16^{th}$ of a clock cycle.

The VCO clock resolution and desired divider ratio 98 may be quantified mathematically as follows. Let the integer portion of desired divider ratio 98 and the number of clocks cycles of selected clock 96 that occur before the phase is stepped be defined as Ndiv and Nshift, respectively. Furthermore, let the number of degrees of phase shift per phase step be defined as PHStep. The desired divider ratio 98 can now be defined as:

N div [1+(PHStep/360)*(1/Nshift)].

The period of divided clock 88 is defined as:

Pclock=(1/$f_{vco}$)[1+(PHstep/360)*(1/Nshift)]*N div.

The non-integer divider generates substantially zero phase noise when Nshift is less than or equal to Ndiv. Stated differently, phase noise is minimal when the number of clock cycles of selected clock 96 is equal to or less than the integer portion of the desired divider ratio. The desired divider ratio is used to determine the Ndiv, Nshift, and PH Step. For example, assume the desired divider ratio is 8.25. Ndiv is equal to the integer portion, 8, of the desired divider ratio and Nshift is selected to be equal to Ndiv. With this information, Phstep can be calculated:

8.25=8*[1+(Phstep/360)*(1/Nshift), which is 8.25/8−1=(Phstep/360)*(1/8), therefore Phstep=0.0312*360*8 which equals 90 degrees.

The period of divided clock 88 is:

(1/fvco)[1+(90/360)*(1/8)]*8 or (1/fvco)[1.0312]*8, therefore the period of divided clock 88 is (1/fvco)*8.25. For a VCO clock frequency of 10 GHz, the period of divided clock 88 is 825 picoseconds.

Figure 4:
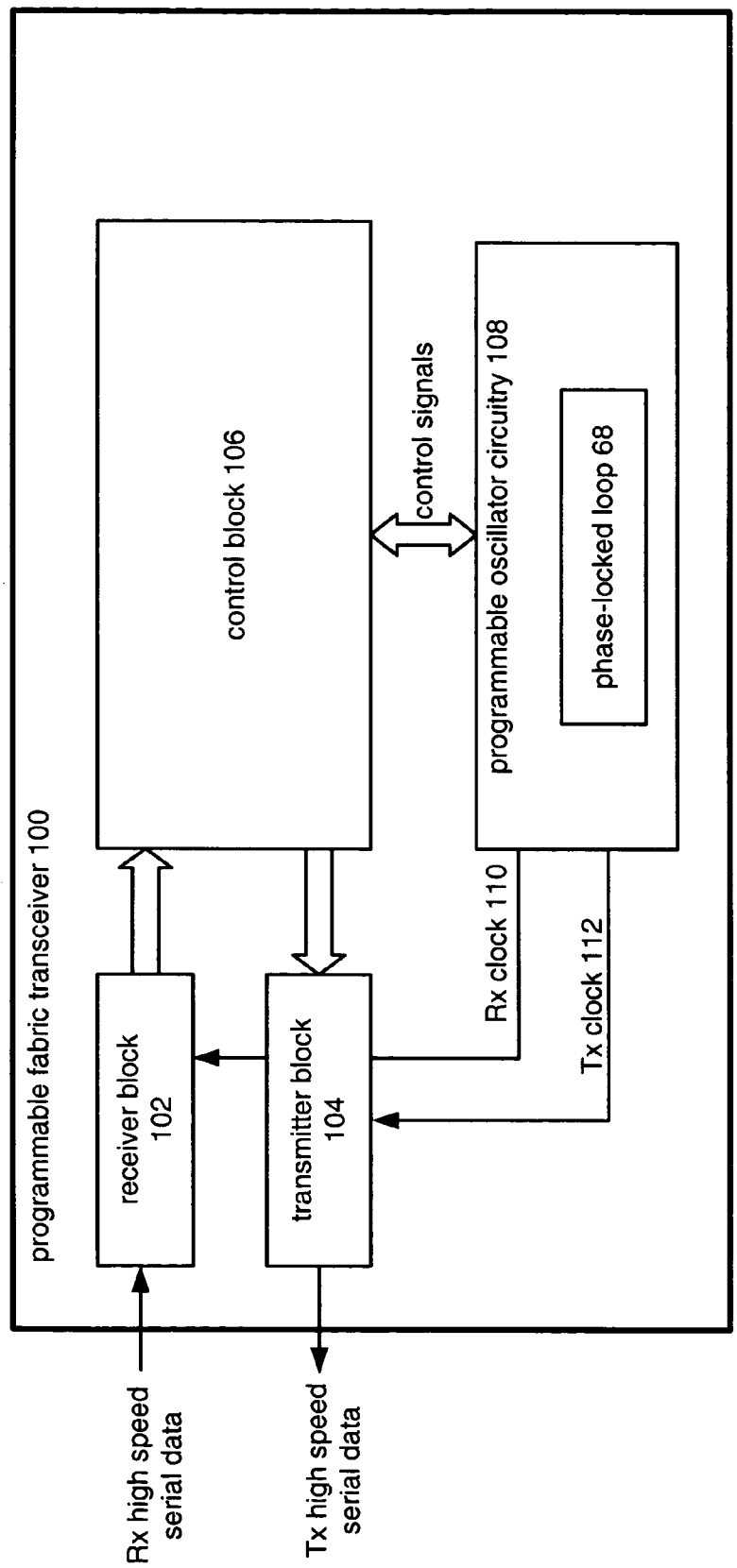
FIG. 4 is a schematic block diagram of a programmable fabric high data rate serial data transceiver according to one embodiment of the present invention.

FIG. 4 is a schematic block diagram of a programmable fabric high data rate serial data transceiver according to one embodiment of the present invention. Programmable fabric transceiver 100 comprises a receiver block 102, a transmitter block 104, a control block 106 and programmable oscillator circuitry 108. Receiver block 102 is coupled to receive the high-speed serial data and to convert the serial data to parallel data based on a receive (Rx) clock 110. Control block 106 receives the parallel data and processes it according to an operating standard stored in programmable fabric transceiver 100. Transmitter block 104 is coupled to receive transmitter (Tx) clock 112 from programmable oscillator circuitry 108 and parallel data from control block 106, converts the parallel data to serial data based on a stored operating standard and transmits the high-speed serial data.

Programmable oscillator circuitry 108 comprises circuitry for generating a plurality of oscillation signals and further includes phase-locked loop 68 of FIG. 3. Control block 106 produces control signals to programmable oscillator circuitry 108 to produce Rx clock and Tx clock 112 according to the operating standard of the transmit and receive blocks. Phase-locked loop 68, as was discussed with respect to FIG. 3, produces a plurality of low phase noise clocks. The low phase noise substantially reduces transmit jitter in block 104 and decoding error in receiver block 102 due to substantially jitter free RX and TX clocks produced from programmable oscillator circuitry 108.

Figure 5:
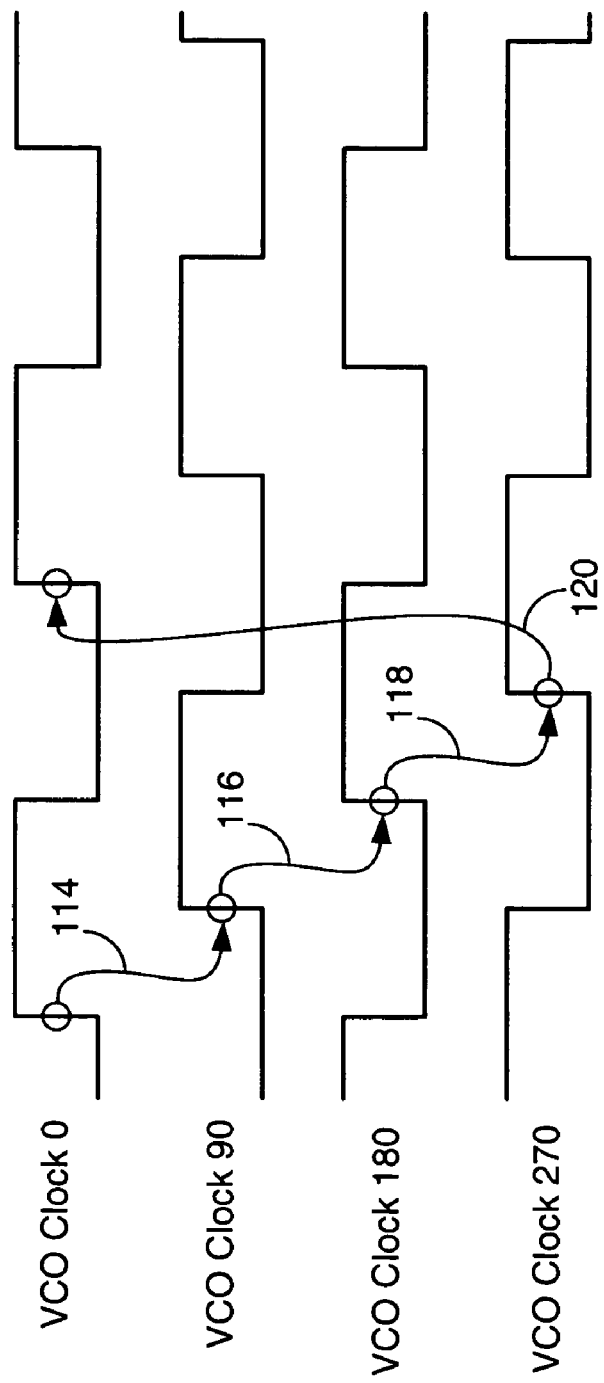
FIG. 5 is a timing diagram of a four-phase clock output according to one embodiment of the present invention.

FIG. 5 is a timing diagram of a four-phase clock output according to one embodiment of the present invention. As was described with reference to FIG. 3, VCO 72 of FIG. 3 produces four clocks, namely, VCO clock 0, VCO clock 90, VCO clock 180 and VCO clock 270. Each clock is delayed from the previous clock by 90 degrees, thereby achieving a one-quarter cycle resolution. As can be seen in FIG. 5, VCO clock 0 rising edge leads the rising edge with VCO clock 90 by 90 degrees as shown by line 114. Similarly, VCO clock 90 leads clock 180 by 90 degrees as illustrated by line 116. Likewise, VCO clock 180 leads clock 270 by 90 degrees and VCO clock 270 leads VCO clock 180 by 90 degrees as illustrated by lines 118 and 120, respectively. Thus, one full clock period of the VCO will have four rising edges, namely, VCO clock 0, VCO clock 90, VCO clock 180 and VCO clock 270.

As will be discussed with respect to the following figures, a method of an embodiment of the present invention discloses switching from the present clock to the new clock during similar logic states to effectively stretch the period of the selected clock that is coupled to the integer divide by N block. By stretching the selected clock by quarter cycle, or, conversely, shrinking the selected clock by one-quarter cycle, divided clock 88 of FIG. 3 produced by the integer divide by N block may be expanded or contracted to adjust to phase/frequency difference between the reference signal 86 and divided clock 88 thereby adjusting the VCO output frequency. By avoiding abrupt changes in the divider ratio, large changes in the phase/frequency detector output are avoided, thereby reducing phase noise.

Figure 6:
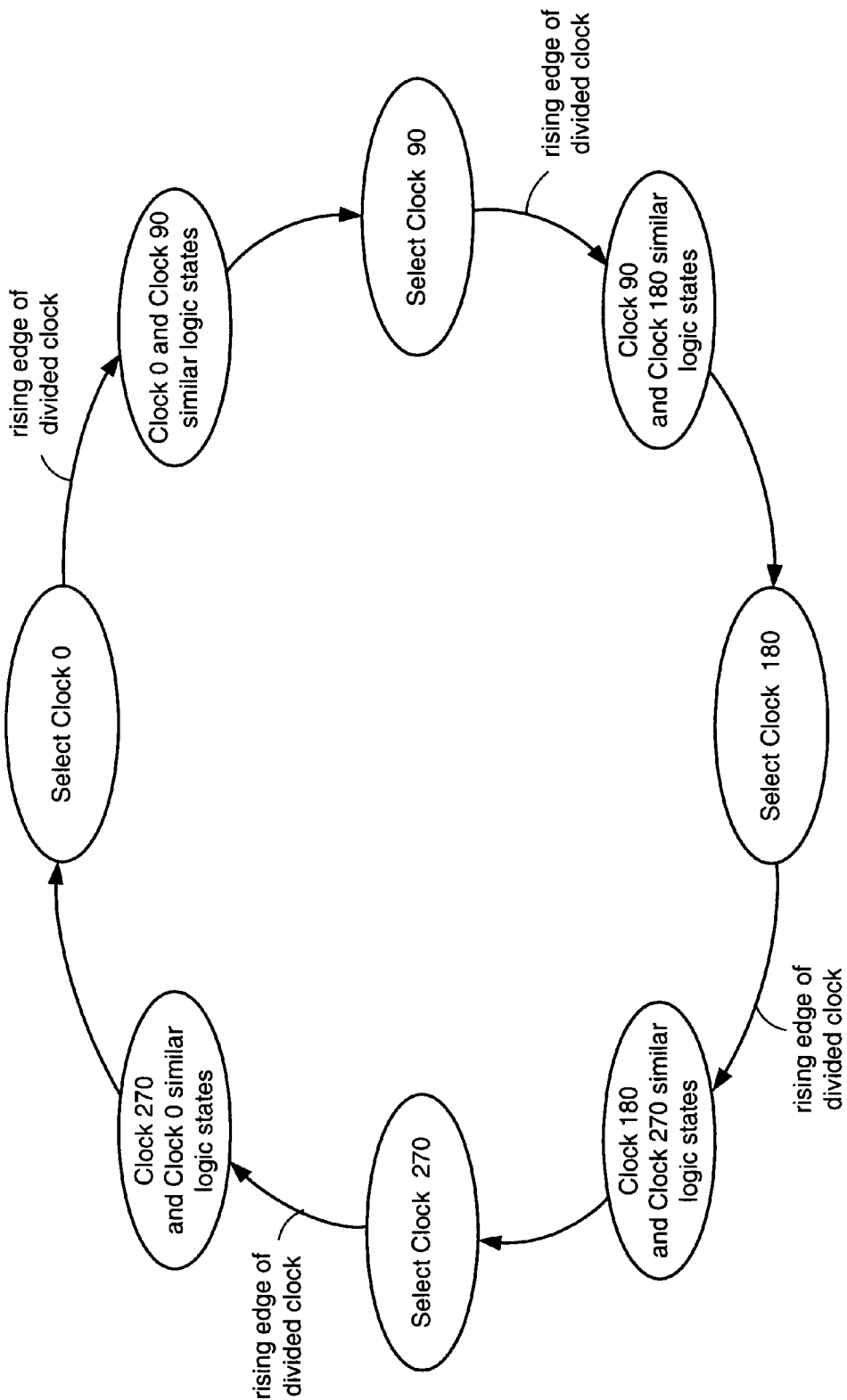
FIG. 6 is a flowchart for a state machine configured for divide by 8.25.

FIG. 6 is a flowchart for a state machine configured for divide by 8.25. The state machine selects a new clock that lags, in phase, the presently selected clock to produce a desired divider ratio that is greater than the divider amount of the integer divide by N block. Stated differently, when the integer divide by N block is configured for divide by 8, the phase lagging clock, in the example of FIG. 6, will select a new clock that lags the presently selected clock by 90 degrees, thus stretching the clock cycle by one-quarter cycle. In a similar manner, the state machine will select the new clock that leads, in phase, the presently selected clock by 90 degrees to produce a desired divider ratio that is less than the divider amount of the divide by N block. Thus, by choosing a leading phase clock, the desired divider ratio is 7.75 wherein N is equal to 8 and further wherein the divider ratio may more generically be referenced as a (N−1).75 divider ratio.

Assuming the state machine has selected VCO clock 0, on the rising edge of the divided clock the state machine determines that the programmable integer divide by N block has divided the selected clock by 8. On the rising edge of the divided clock, the state machine waits until clock 0 and clock 90 are both at similar logic states. Once clock 0 and clock 90 are at similar logic states, logic 1 for example, the state machine will select clock 90 by configuring clock select signal 94 of FIG. 3 to select clock 90. When the programmable integer divide by N block 76 of FIG. 3 divides the selected clock by 8, the rising edge of the divided clock will go to logic 1 and the state machine will wait until clock 90 and clock 180 are at similar logic states before selecting clock 180. In a similar manner, the state machine will select clock 270 and then repeat the cycle back to select clock 0. By switching from the presently selected clock to a new clock that lags in phase by 90 degrees, each full cycle of the divided clock is stretched by one-quarter period relative to the undivided VCO clock period. By stretching the divided clock by one-quarter cycle during each period of the divided clock, the VCO input voltage produced by the phase/frequency to voltage converter block 70 of FIG. 3 will produce a fractional divide ratio of 8.25 which may further be referenced as N.25. Stated differently, the VCO output frequency will be equal to 8.25 (N.25) times the reference signal.

Figure 7:
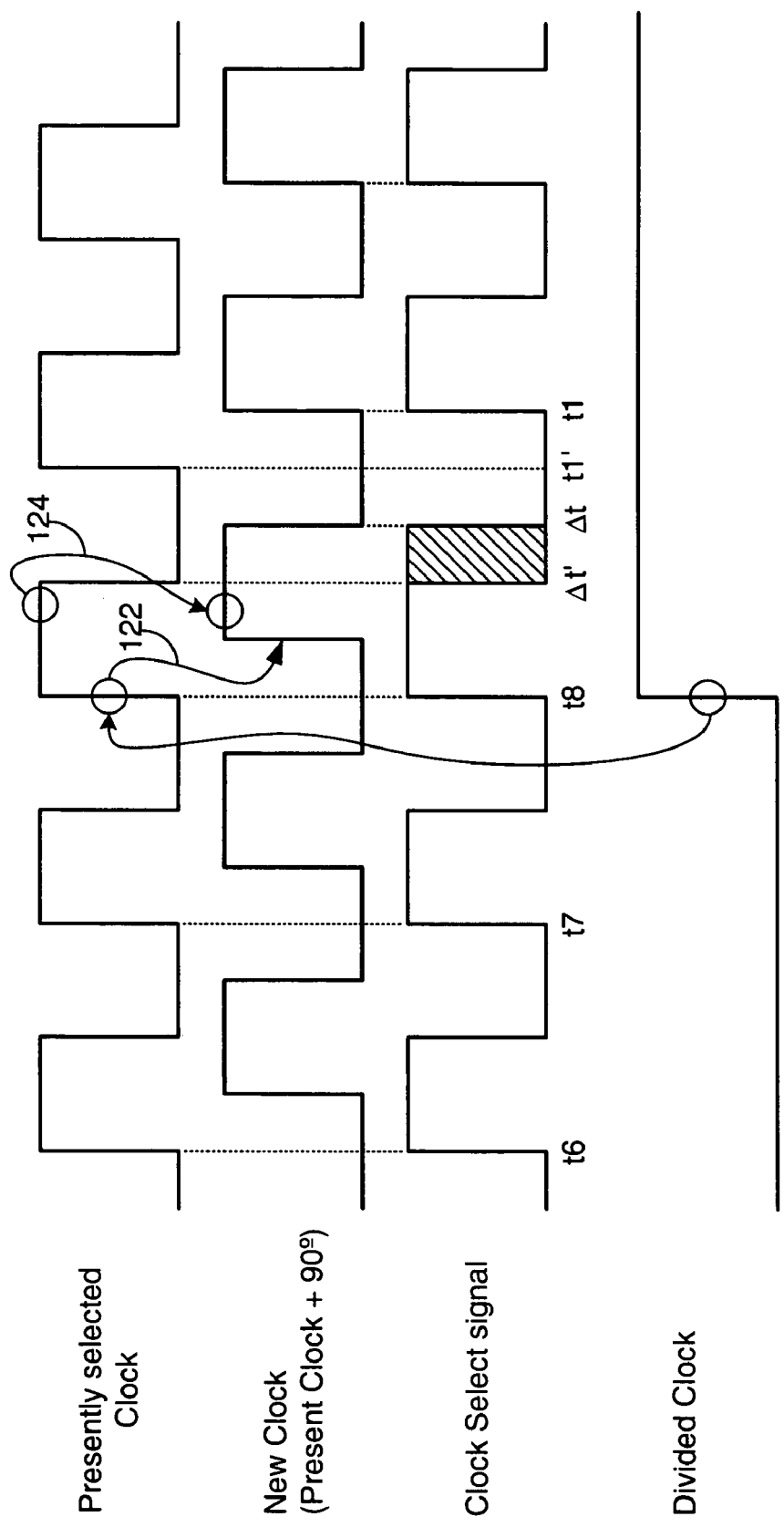
FIG. 7 is a timing diagram illustrating a desired divider ratio of 8.25.

FIG. 7 is a timing diagram illustrating a desired divider ratio of 8.25. For a presently selected clock, the state machine will, on the rising edge of the divided clock, select a new clock that lags the presently selected clock by 90 degrees, as illustrated by line 122. Once the rising edge of the divided clock is detected by the state machine, the state machine will select the new clock when the presently selected clock and the new clock are at similar logic states, as illustrated by line 124. In this example, the selected logic state is logic 1 but logic 0 may be also selected. By switching from the presently selected clock to the new clock, as shown by line 124, the clock select signal will be stretched such that the period of clock select signal will be stretched from t8 to Δt. Thus, the period of the clock select signal after the rising edge of the divided clock is extended from Δt' to Δt. The period from Δt' to Δt corresponds to one-quarter cycle of the presently selected clock, thus, the period of the divided clock is stretched by one-quarter cycle. Once this pulse period is stretched by switching from the presently selected clock to the new clock, the clock select signal is the new clock. This pattern repeats itself to maintain a desired divider ratio of 8.25.

Figure 8:
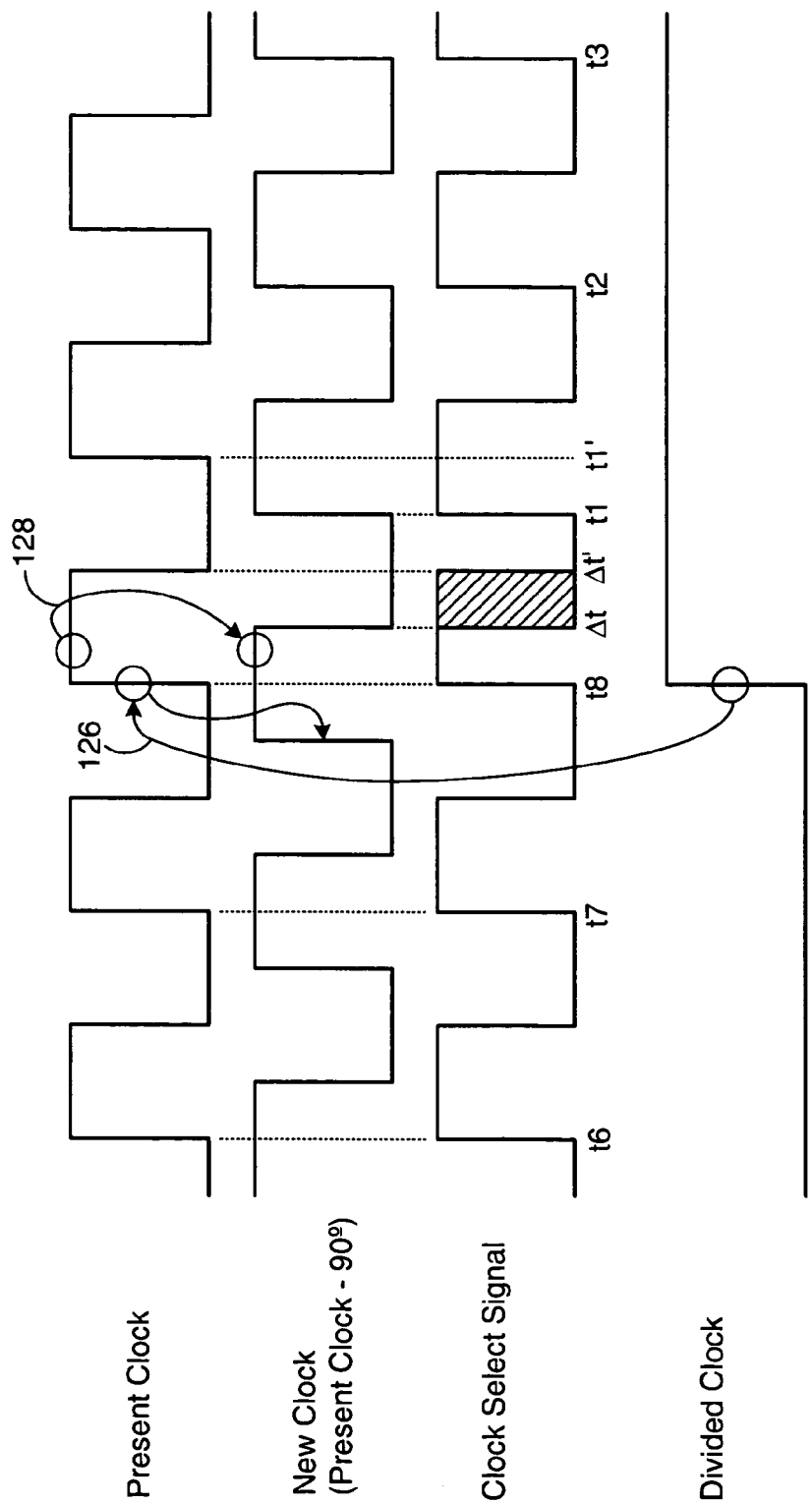
FIG. 8 is a timing diagram illustrating a desired divider ratio of 7.75.

FIG. 8 is a timing diagram illustrating a desired divider ratio of 7.75. For a presently selected clock, the state machine will, on the rising edge of the divided clock, select a new clock that leads the presently selected clock by 90 degrees, as illustrated by line 126. Once the rising edge of the divided clock is detected by the state machine, the state machine will select the new clock when the presently selected clock and the new clock are at similar logic states, as illustrated by line 128. In this example, the selected logic state is logic 1 but logic 0 may be also selected. By switching from the presently selected clock to the new clock, as shown by line 128, the clock select signal will be reduced such that the logic 1 pulse of the clock select signal will be reduced from Δt' to Δt. Thus, the period of one cycle of the clock select signal is reduced from t1' to t1. The period from Δt' to Δt corresponds to one-quarter cycle of the presently selected clock, thus, the period of the divided clock is reduced by one-quarter cycle. Once this pulse period is reduced by switching from the presently selected clock to the new clock, the clock select signal is the new clock. This pattern repeats itself to maintain a desired divider ratio of 7.75.

Figure 9:
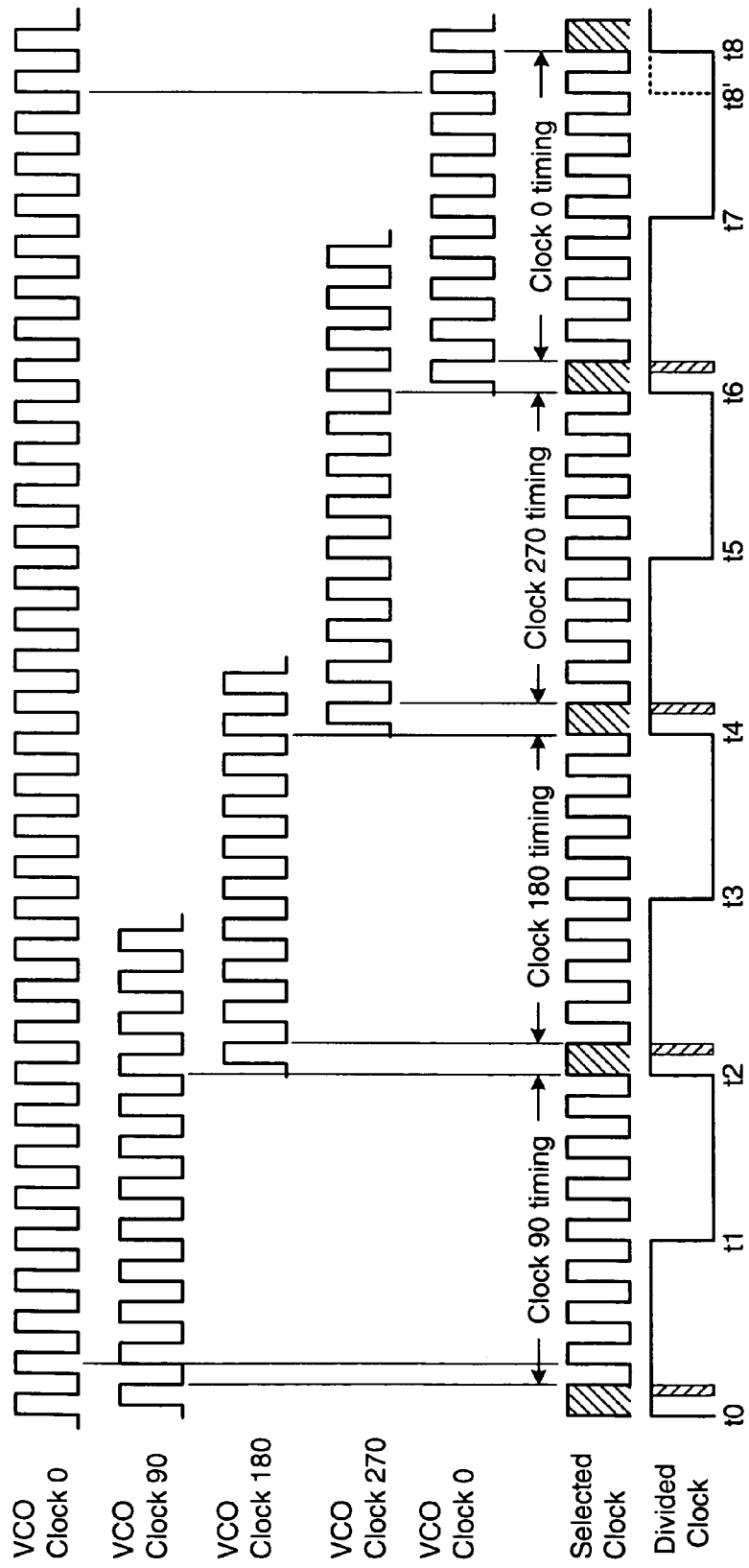
FIG. 9 is a timing diagram of a desired divider ratio of 8.25.

FIG. 9 is a timing diagram of a desired divider ratio of 8.25. The timing diagram of FIG. 9 is identical to the timing diagram of FIG. 7 extended over four cycles to illustrate the state machine's selection of the presently selected clock and the new clock. At time t0 of the divided clock when the presently selected clock is VCO clock 0, the state machine will wait until the presently selected clock (VCO clock 0) and the new clock (VCO clock 90) are at a similar logic state, logic 1 for example, before the clock select signal selects VCO clock 90 from the multiplexer. Thus, the first pulse of the clock select signal is stretched by one-quarter cycle as was described with respect to FIG. 7. The clock select signal will have the timing relationship of clock 90 until the integer divide by N block has divided the clock select signal by 8.

On the next rising edge of the divided clock at time t2, the state machine will switch from the presently selected clock (VCO clock 90) to the new clock (VCO clock 180) when both are at similar logic states. The state machine switches the multiplexer via the clock select signal to output VCO clock 180 as the selected clock. This cycle repeats itself until the presently selected clock is VCO clock 270. On the rising edge of the divided clock at time t6, the state machine will select the new clock as the clock that lags clock 270 by 90 degrees or, in other words, clock 0. As can be seen in FIG. 9, over four cycles of the divided clock, each logic 1 pulse of the divided clock has been stretched by one-quarter cycle, thus producing a divided clock that is stretched by one full cycle of the VCO clock 0. As can be further seen, the divided clock has been stretched from t8' to t8 relative to the VCO clock 0. Thus, over four cycles of the divided clock, 33 pulses of the VCO clock have been divided by four, thus producing a desired divider ratio of 8.25.

Figure 10:
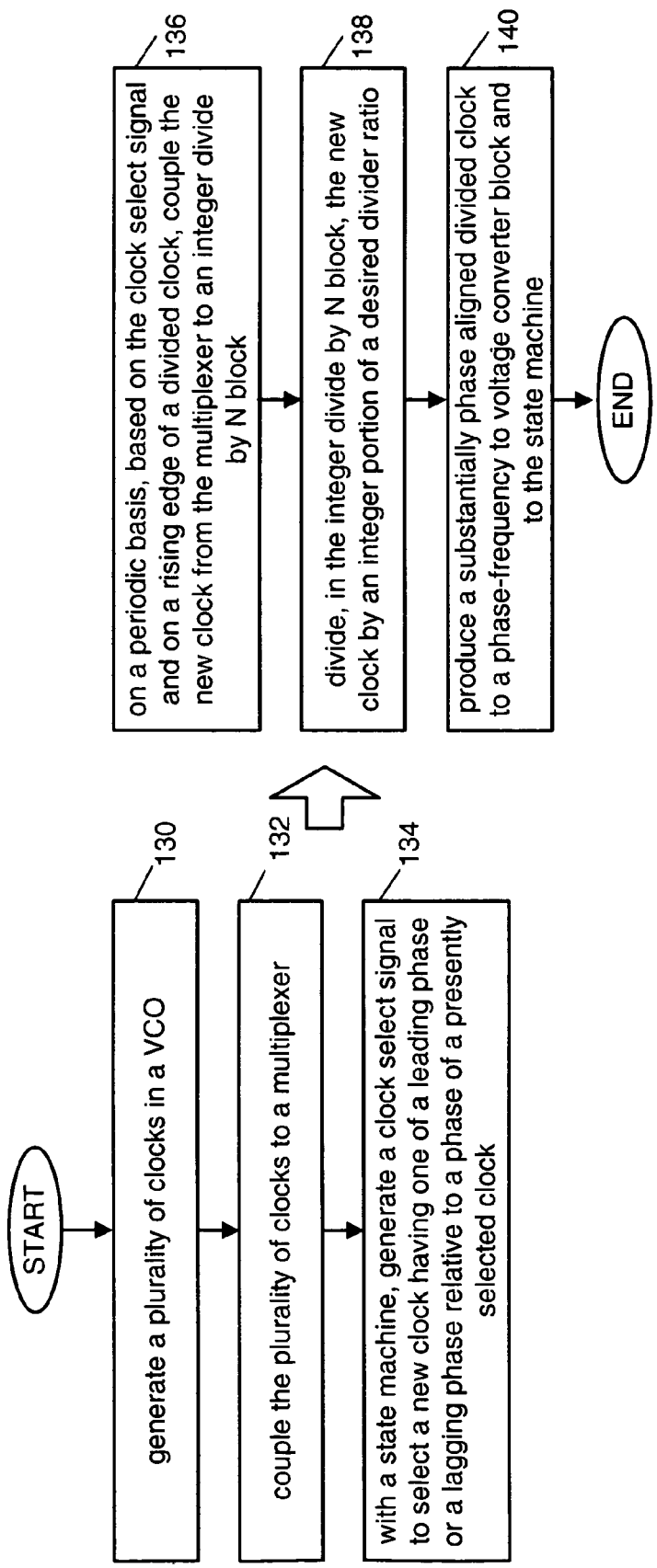
FIG. 10 is a flow chart for a method for generating a non-integer divider ratio in a PLL.

FIG. 10 is a method flow chart for generating a non-integer divider ratio with low phase noise in a phase-locked loop. A plurality of clocks is generated in a VCO (step 130). The number of clocks generated is determined by a desired resolution of the non-integer divider ratio. Each clock of the plurality of clocks is shifted in phase to provide a plurality of clock phases. The plurality of clocks is coupled to a multiplexer (step 132). The multiplexer will select one clock from the plurality of clocks based on a logic state of a clock select signal. A state machine generates the clock select signal to select a new clock from the multiplexer. The new clock will have one of a leading or lagging phase with respect to the presently selected clock (step 134). The state machine selects the leading or lagging phase to either expand or contract the period of the selected clock. On a periodic basis, based on the clock select signal and on a rising edge of a divided clock, the new clock is coupled from the multiplexer to an integer divide by N block (step 136). The integer divide by N block divides the new clock by the integer portion of the desired divider ratio (step 138). Since the period of the new clock is expanded or contracted by the leading or lagging phase, the period of the divided clock is substantially equal to the desired non-integer divide ratio. The phase-locked loop is closed by producing a substantially phase aligned divided clock to the phase/frequency to voltage converter block and to the state machine (step 140). The phase/frequency to voltage converter produces a VCO input voltage to adjust the oscillation frequency of the VCO in order to maintain a lock-loop condition.

The invention disclosed herein is susceptible to various modifications and alternative forms. Specific embodiments therefore have been shown by way of example in the drawings and detailed description. It should be understood, however, that the drawings and detailed description thereto are not intended to limit the invention to the particular form disclosed, but on the contrary, the invention is to cover all modifications, equivalents and alternatives falling within the spirit and scope of the present invention as defined by the claims.

What is claimed is:

1. A phase-locked loop (PLL) for high data rate serial digital communications, comprising:
 a phase/frequency to voltage converter block for producing a voltage controlled oscillator (VCO) input voltage based upon a phase of a divided clock in relation to a reference signal;
 a VCO producing a plurality of clocks based upon the VCO input voltage;

a multiplexer coupled to receive the plurality of clocks and further coupled to receive a clock select signal wherein the multiplexer produces a selected clock based upon the clock select signal;

an integer divide by N block coupled to receive the selected clock wherein the integer divide by N block divides the selected clock by an integer amount to produce the divided clock;

a state machine for generating the clock select signal wherein the state machine selects a clock according to a desired divider ratio; and wherein the state machine is adapted to obtain the desired divider ratio by adjusting a pulse period of one cycle of the clock select signal until a phase and frequency of the clock select signal is equal to a phase and frequency of the selected clock.

2. The PLL of claim 1 wherein the clock select signal may be changed on every cycle of the divided clock.

3. The PLL of claim 2 wherein the integer divide by N block operates as a non-integer fractional N divider to provide a jitter free non-integer divided signal to the phase/frequency to voltage converter block.

4. The PLL of claim 1 wherein a number of clocks that are selectable by the clock select signal is equal to a reciprocal of a non-integer portion of the desired divider ratio.

5. The PLL of claim 2 wherein the plurality of clocks is equal to one of two, four, six, eight, ten, twelve, sixteen or thirty two.

6. The PLL of claim 5 wherein a divisor amount of the integer divide by N block is equal to eight and the number of clocks of the plurality of clocks produced by the VCO is equal to four.

7. The PLL of claim 1 wherein the state machine selects a new clock on an Nth pulse of a presently selected clock wherein N is an integer portion of the desired divider ratio.

8. The PLL of claim 1 wherein the state machine selects a new clock that leads a presently selected clock, in phase, to produce the desired divider ratio that is less than a divider ratio of a divisor amount of the integer divide by N block.

9. The PLL of claim 8 wherein the divisor amount of the integer divide by N block is equal to eight, a number of clocks of the plurality of clocks is equal to four, and wherein the state machine selects the new clock that leads the presently selected clock in phase by 90 degrees to produce an effective fractional N of (N−1).75.

10. The PLL of claim 1 wherein the state machine selects a new clock that lags a presently selected clock, in phase, to produce the desired divider ratio that is greater than the divider ratio of a divisor amount of the integer divide by N block.

11. The PLL of claim 10 wherein the divisor amount of the integer divide by N block is equal to eight, a number of clocks of the plurality of clocks is equal to four, and wherein the state machine selects the new clock that lags the presently selected clock in phase by 90 degrees to produce an effective fractional N of N.25.

12. The PLL of claim 1 wherein the state machine only generates a new clock select signal when a presently selected clock and a new clock are at a similar logic state.

13. The PLL of claim 12 wherein the similar logic state is one of a logic one and a logic zero.

14. The PLL of claim 1 wherein the VCO comprises a ring oscillator having a number of delay elements that is one-half the number of clocks of the plurality of clocks.

15. The PLL of claim 1 wherein the VCO comprises a ring oscillator having a number of delay elements that is equal to the number of clocks of the plurality of clocks.

16. A programmable fabric high data rate serial data transceiver, comprising:

transmitter block for transmitting high data rate serial data based upon a Tx clock;

receiver block for receiving high data rate serial data based upon an Rx clock;

programmable oscillator circuitry for generating at least one of the Tx clock and the Rx clock, the programmable oscillator circuitry further including a phase-locked loop, the phase-locked loop comprising:

phase/frequency to voltage converter block for producing a VCO input voltage based upon a phase of a divided clock in relation to a reference signal;

voltage controlled oscillator for producing a plurality of clocks based upon the VCO input voltage;

multiplexer coupled to receive the plurality of clocks and further coupled to receive a clock select signal wherein the multiplexer produces a selected clock based upon the clock select signal;

circuitry for dynamically generating the clock select signal; divide circuitry for dividing a presently selected clock by an integer value; and wherein the circuitry dynamically generates the clock select signal by adjusting a pulse period of one cycle of the clock select signal until a phase and frequency of the clock select signal is equal to a phase and frequency of the selected clock.

17. The programmable fabric high data rate serial data transceiver of claim 16 wherein the divide circuitry comprises a programmable integer divide by N block coupled to receive the presently selected clock, wherein the integer divide by N block divides the presently selected clock by the integer value to produce a divided clock and wherein the divided clock substantially matches the reference signal in phase and frequency and comprises an effective non-integer divided clock value.

18. The programmable fabric high data rate serial data transceiver of claim 16 wherein the circuitry for generating the clock select signal comprises a programmable state machine for generating the clock select signal and wherein the state machine selects a new clock according to a desired divider ratio.

19. The programmable fabric high data rate serial data transceiver of claim 18 wherein the clock select signal selects the new clock that leads the presently selected clock, in phase, to produce the desired divider ratio that is less than a divider ratio of a divisor amount of the integer divide by N block.

20. The programmable fabric high data rate serial data transceiver of claim 19 wherein the divisor amount of the integer divide by N block is equal to eight, a number of clocks of the plurality of clocks is equal to four, and the clock select signal selects the new clock that leads the presently selected clock in phase by 90 degrees to produce an effective fractional N of (N−1).75.

21. The programmable fabric high data rate serial data transceiver of claim 18 wherein the state machine selects the new clock that lags the presently selected clock in phase to produce the desired divider ratio that is greater than the divider ratio of the divisor amount of the integer divide by N block.

22. The programmable fabric high data rate serial data transceiver of claim 21 wherein the divisor amount of the integer divide by N block is equal to eight, the number of clocks of the plurality of clocks is equal to four, and the clock select signal selects the new clock that lags the presently selected clock, in phase, by 90 degrees to produce an effective fractional N of N.25.

23. The programmable fabric high data rate serial data transceiver of claim 22 wherein the state machine only generates a new clock select signal when the presently selected clock and the new clock are at a similar logic state.

24. The programmable fabric high data rate serial data transceiver of claim 23 wherein the similar logic state is one of a logic one and a logic zero.

25. A method for generating a non-integer divider ratio in a PLL, comprising:
   generating a plurality of clocks in a VCO;
   coupling the plurality of clocks to a multiplexer;
   selecting, based on a clock select signal, a clock from the plurality of clocks for coupling to an integer divide by N block;
   dividing the selected clock by an integer portion of a desired divider ratio using the integer divide by N block;
   producing a substantially phase aligned divided clock to a phase/frequency to voltage converter block and to a state machine; and
   wherein selecting the clock comprises adjusting a pulse period of one cycle of the clock select signal until a phase and frequency of the clock select signal is equal to a phase and frequency of the selected clock.

26. The method of claim 25 wherein the clock select signal generated by the state machine selects a new clock to have one of a leading phase or a lagging phase relative to a phase of a presently selected clock.

27. The method of claim 26 wherein the new clock is selected from the plurality of clocks based on a rising edge of the divided clock on a periodic basis.

28. The method of claim 25 wherein a frequency of the VCO clocks are substantially equal to a reference signal multiplied by the desired non-integer divider ratio.

* * * * *